United States Patent
Chou

(10) Patent No.: US 8,742,595 B1
(45) Date of Patent: Jun. 3, 2014

(54) MEMS DEVICES AND METHODS OF FORMING SAME

(71) Applicant: Taiwan Semiconductor Manufacturing Company, Ltd., Hsin-Chu (TW)

(72) Inventor: Bruce C. S. Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/953,238

(22) Filed: Jul. 29, 2013

Related U.S. Application Data

(62) Division of application No. 13/189,057, filed on Jul. 22, 2011, now Pat. No. 8,497,148.

(51) Int. Cl.
  *H01L 21/58* (2006.01)
  *H01L 23/48* (2006.01)
(52) U.S. Cl.
  USPC .......... 257/774; 257/414; 257/415; 257/416; 257/417; 257/418; 257/419; 257/777; 257/E23.01; 257/E23.174

(58) Field of Classification Search
  USPC ......... 257/414, 415, 416, 417, 418, 419, 774, 257/777, E23.01, E23.174
  See application file for complete search history.

(56) References Cited

U.S. PATENT DOCUMENTS 8,227,285 B1 * 7/2012 Yang .............................. 438/50
2012/0261830 A1 * 10/2012 Chu et al. ..................... 257/774

* cited by examiner

*Primary Examiner* — Peniel M Gumedzoe
(74) *Attorney, Agent, or Firm* — Slater and Matsil, L.L.P.

(57) ABSTRACT

The present invention provides a MEMS structure comprising confined sacrificial oxide layer and a bonded Si layer. Polysilicon stack is used to fill aligned oxide openings and MEMS vias on the sacrificial layer and the bonded Si layer respectively. To increase the design flexibility, some conductive polysilicon layer can be further deployed underneath the bonded Si layer to form the functional sensing electrodes or wiring interconnects. The MEMS structure can be further bonded to a metallic layer on top of the Si layer and the polysilicon stack.

18 Claims, 5 Drawing Sheets

MEMS DEVICES AND METHODS OF FORMING SAME

CLAIM TO PRIORITY

This application is a divisional of and claims priority to U.S. patent application Ser. No. 13/189,057, filed on Jul. 22, 2011, and entitled "MEMS Devices and Methods of Forming Same," which application is incorporated herein by reference.

BACKGROUND

Microelectromechanical systems (MEMS) are the technology of forming micro-structures with dimensions in the micrometer scale (one millionth of a meter). Significant parts of the technology have been adopted from integrated circuit (IC) technology. Most of the devices are built on silicon wafers and realized in thin films of materials. There are three basic building blocks in MEMS technology, which are the ability to deposit thin films of material on a substrate, to apply a patterned mask on top of the films by photolithographic imaging, and to etch the films selectively to the mask. A MEMS process is usually a structured sequence of these operations to form actual devices.

MEMS applications include inertial sensors applications, such as accelerometers for measuring linear acceleration and gyroscopes for measuring angular velocity. Other MEMS applications include optical applications such as movable mirrors, and RF applications such as RF switches and resonators.

For MEMS systems, usually, a floating mechanical structure is formed to provide the pre-defined working function. Below the floating structure, a gap or cavity is formed thereat, and at least a beam or spring is formed to link the floating structure to an anchor area that is fixed to the carrier substrate. For fabrication, the formation of the gap or cavity can be developed by various methods, especially for inertial sensors applications. The popular methods include Silicon on Insulator (SOI) MEMS with oxide sacrificial layer, polysilicon with oxide sacrificial layer, and Si bonding on cavities.

A typical MEMS system using a SOI (silicon on insulator) wafer as the manufacturing material may comprise a silicon carrier wafer including an oxide layer formed thereon. A device silicon wafer may be bonded to the oxide layer. A plurality of etch windows may be formed by removing a part of the device silicon wafer, which may be achieved by dry or wet etch process for Si. This etch step is to define the MEMS structure area and anchor area and additionally a supporting beam or spring through the etch windows, the last etch step is adopted for removing the oxide layer underneath the MEMS structure to form the gap or cavity. The etch profile is isotropic and therefore, some oxide layer under the anchor area is also etched to form an undercut, which makes the anchor geometry design more difficult to control.

Further, the SOI wafer approach is much more expensive than the common used silicon wafer and this SOI scheme can't afford the interconnect layers underneath the MEMS structure for sensing electrodes or electrical routing. Therefore there is a need for exploring alternative designs.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and forming of the present exemplary embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely wafer surface micromachining with bonded Si and polysilicon anchor for MEMS systems, and methods of forming the same.

Figure 1A:
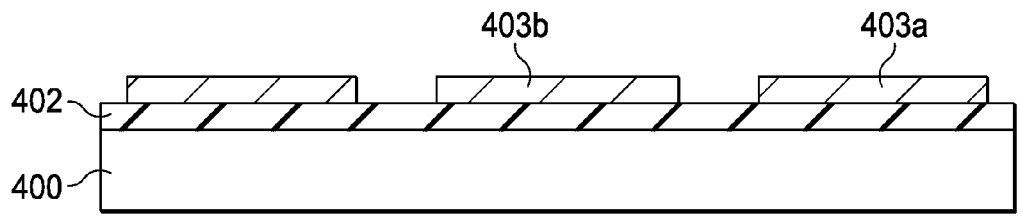
FIGS. 1A-1P are schematic views of various steps in the formation of illustrative embodiments of MEMS devices.
Figure 1B:
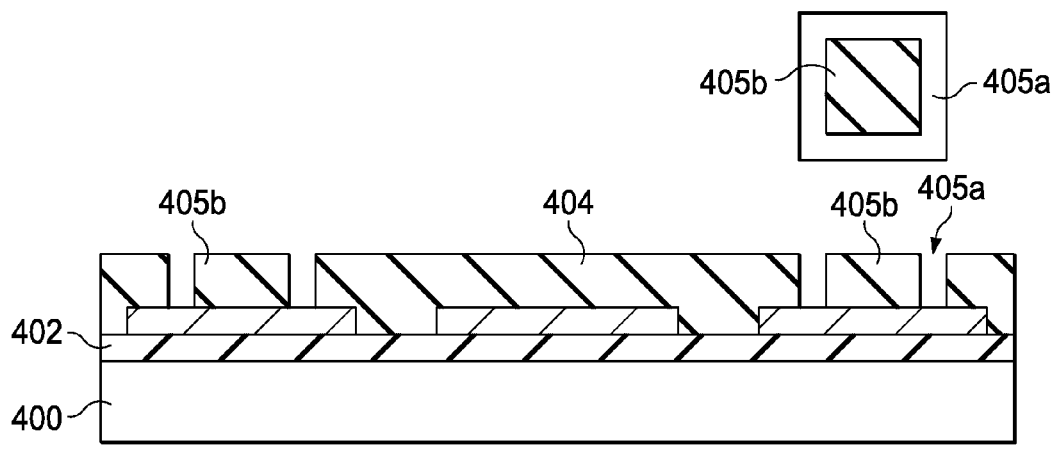
Figure 1C:
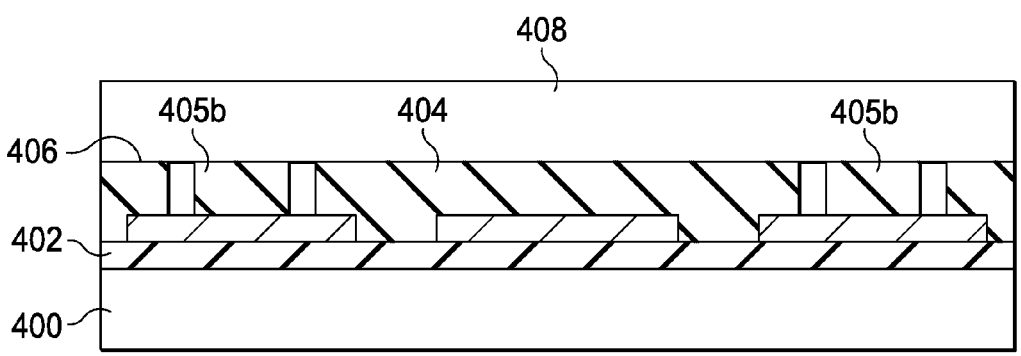
Figure 1D:
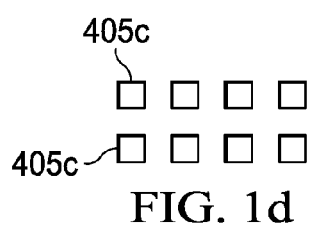
Figure 1E:
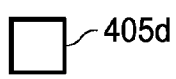
Figure 1F:
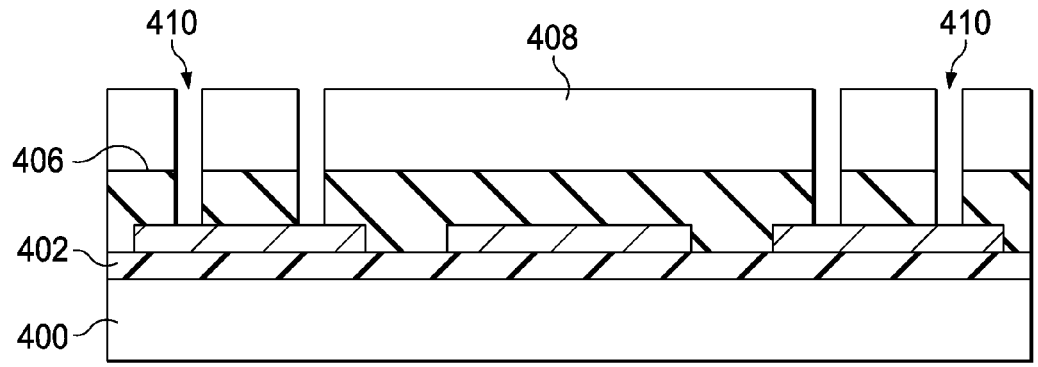
Figure 1G:
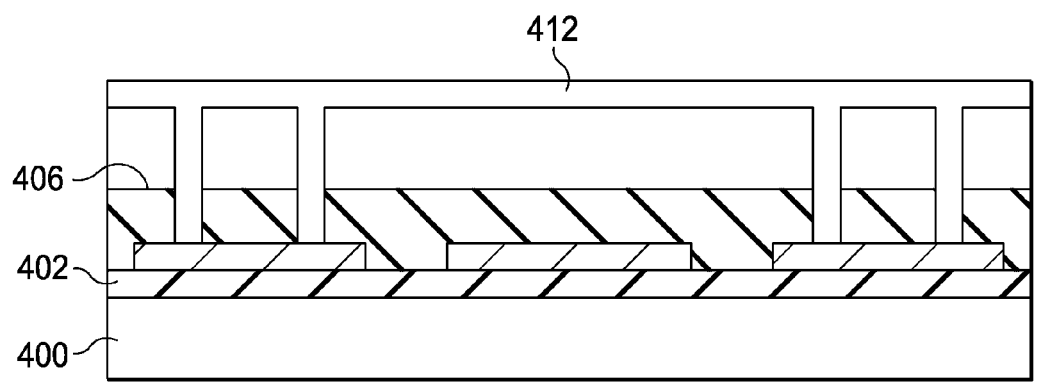
Figure 1H:
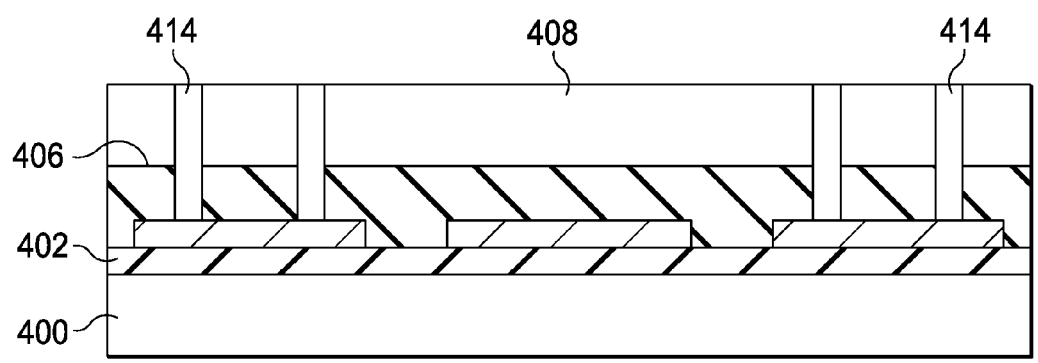
Figure 1I:
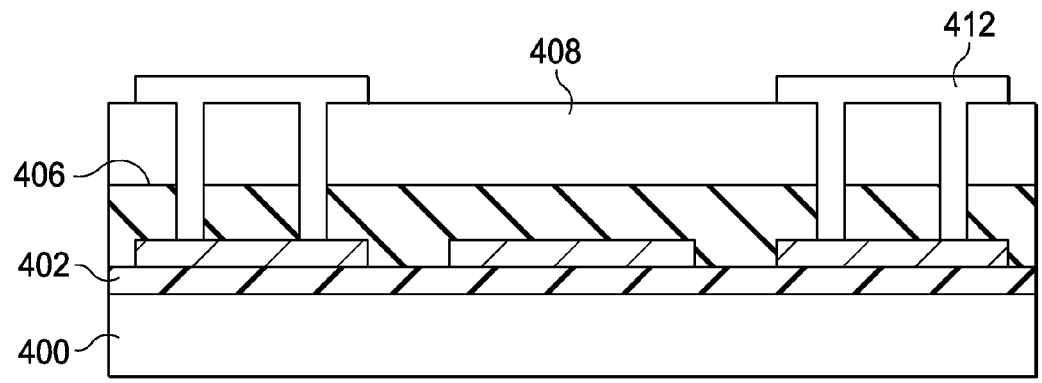
Figure 1J:
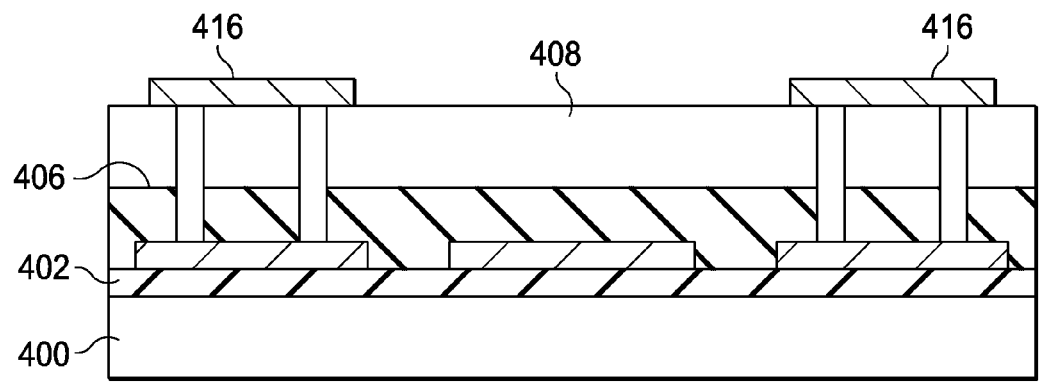
Figure 1K:
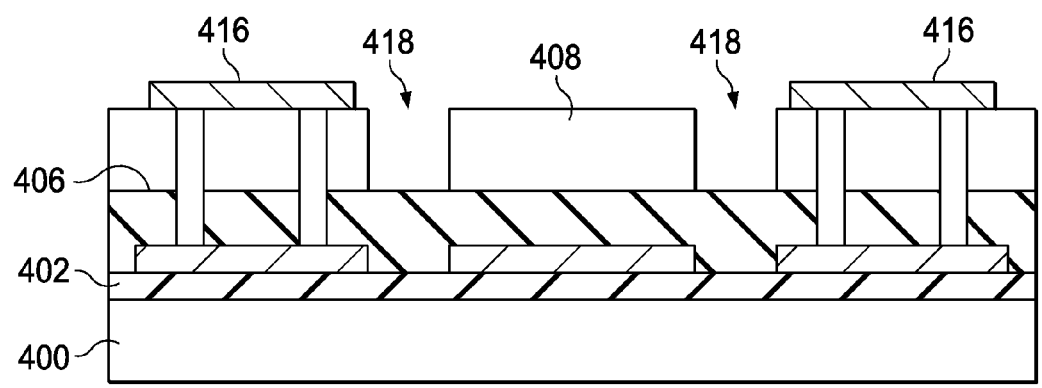
Figure 1L:
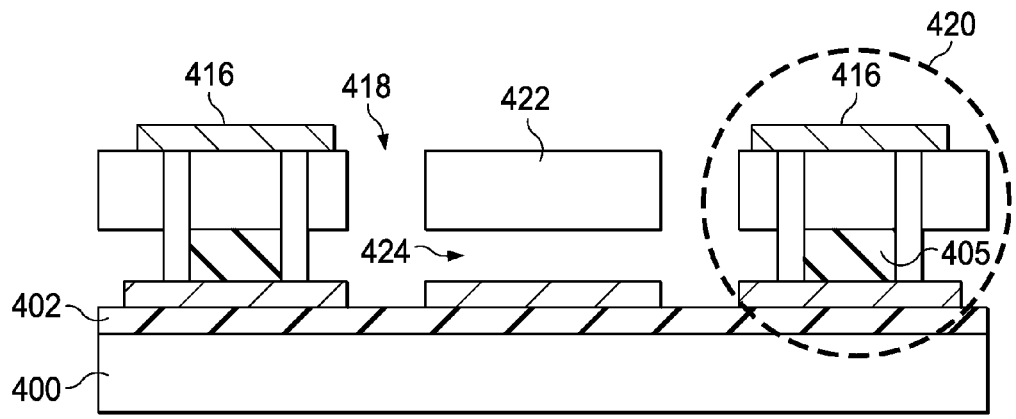
Figure 1M:
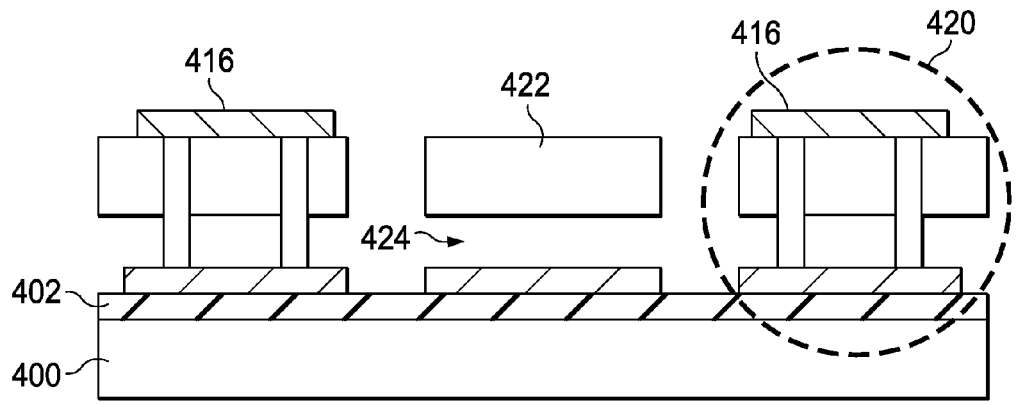
Figure 1N:
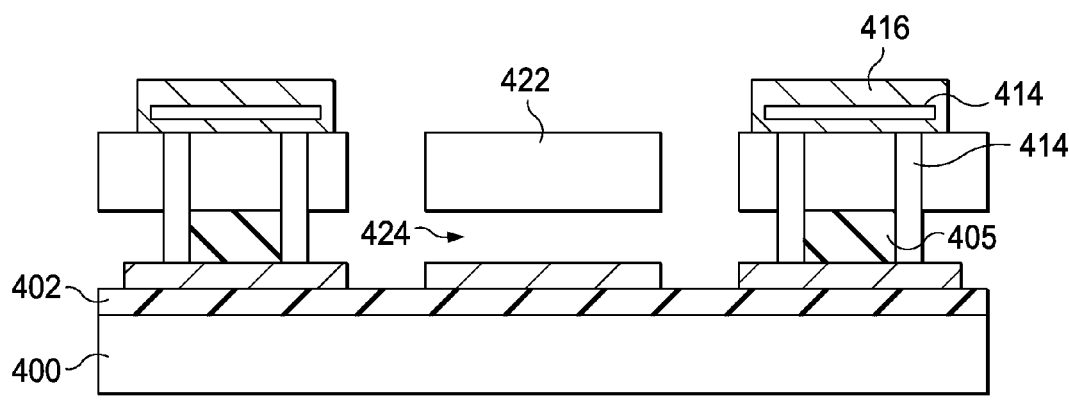
Figure 1O:
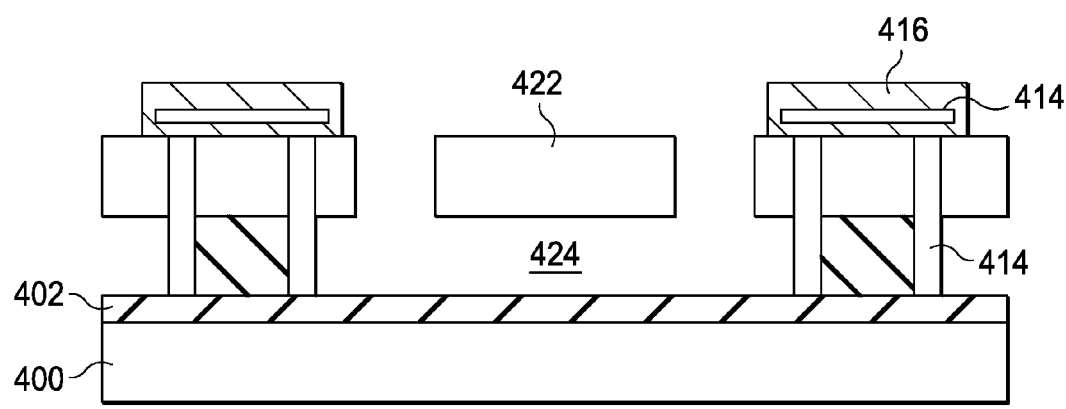
Figure 1P:
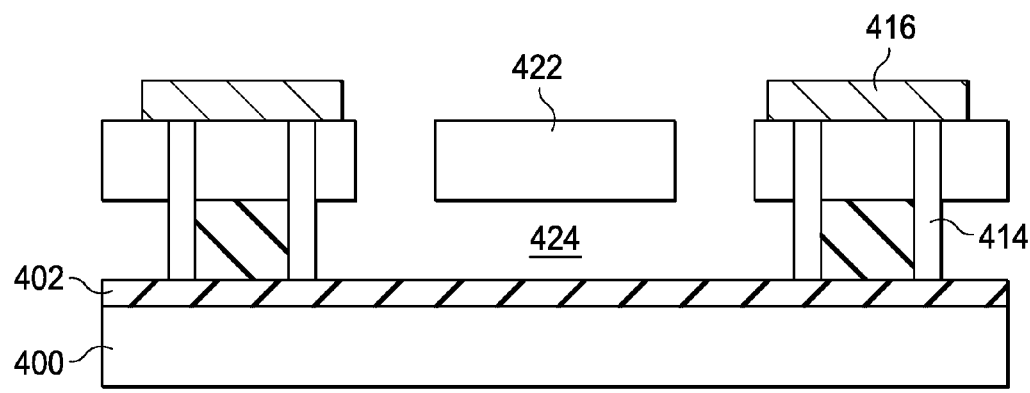

FIG. 1, which includes FIGS. 1a through 1p, illustrates a first embodiment MEMS structure. As shown in FIG. 1a, a wafer 400 has formed thereon an isolation layer 402. Wafer 400 is illustratively bulk silicon, although other wafers such as germanium, silicon-germanium, gallium-arsenide, other III-V materials, II-VI materials, could be employed. Likewise, other than a bulk wafer could be employed and realize some of the benefits of the described embodiments, such as an SOI wafer. Isolation layer 402 may comprise silicon nitride materials, including stochiometric and silicon rich nitride materials. One skilled in the art will recognize that other materials, providing similar insulating, passivating, and etch selectivity could be employed in addition to or in lieu of silicon nitride. For better stress and etch selectivity, the silicon nitride is deposited by LPCVD and its constitution can be modified by tuning the gas ration of $SiH_2Cl_2$ and $NH_3$. Of course, this isolation layer could also be a combination of various material layers such as oxide and nitride to fit the application requirements.

A polysilicon layer is formed on isolation layer 402 and patterned, using well known deposition and patterning techniques, to form, e.g., anchor electrode 403a and sensing electrode 403b. Although a single polysilicon layer is illustrated, those skilled in the art will recognize that multiple polysilicon layers could be employed. Alternatively, an appropriate conducting material could likewise be employed for form anchor electrode. Alternatively, an appropriate conducting material could likewise be employed for form anchor electrode 403a and sensing electrode 403b. In yet other embodiments, where anchor electrode 403a and sensing electrode 403b are not required, there may be no patterned polysilicon layer formed.

A sacrificial oxide layer 404 is further formed on the isolation layer 402, as illustrated in FIG. 1b. The oxide layer 404 can be formed by methods such as LPTEOS, PECVD or HDPCVD. Other alternative will be apparent to those skilled in the art. An illustrative embodiment uses LPTEOS to deposit the sacrificial oxide layer 404. This technique can deliver a more stable stress behavior in the resulting oxide layer. The sacrificial oxide layer 404 has a flat surface, and has a thickness of at least 1 µm and in some embodiments a thickness of at least 2 µm. If a sufficiently flat surface is not obtained by the oxide deposition or formation process, flatness can be achieved by employing a CMP process or an etch back process, as are known in the art.

The sacrificial oxide layer 404 has at least one oxide opening 405a formed therein, which reaches the anchor electrode 403a or the isolation layer 402. FIG. 1b, which is a cross section shows such an opening 405a formed around an island 405b. FIG. 1b also illustrates a portion of the structure in plan (top) view. As can be seen, in the illustrated embodiment, a single trench 405a is formed in sacrificial oxide layer 404, which trench roughly equates to the size and shape of anchor electrode 403a. The position and the number of openings and/or trenches 405a illustrated in FIG. 1b is only for illustrative purposes. There can be any number of openings or trenches in the sacrificial layer 404, in various other positions. As but two examples, FIGS. 1d and 1e illustrate alternative embodiments. In FIG. 1d, which illustrates a portion of the structure in plan (top) view, it can be seen that the openings in sacrificial oxide layer 404 take the form of a multiple vias in sacrificial oxide layer 404, the covering area of the multiple vias roughly corresponding to the size and shape of anchor electrode 403a. In FIG. 1e, the opening 405d in sacrificial oxide layer 404 takes the form of a single via that is aligned with anchor electrode 403a.

One skilled in the art will recognize that openings 405a, 405c, 405d, may be formed using conventional photolithography/patterning and etching techniques. An advantageous feature of the illustrative embodiments is that the area of opening 405a, 405c, 405d, be 5% or less of the total surface area of the device. Stated another way, the surface area of sacrificial oxide layer 404 is preferably 95% intact, with the opening constituting 5% or less of the total surface are. This is advantageous because the surface area of sacrificial oxide layer 404 will be used as the bonding surface 406 for device wafer 408, as illustrated by FIG. 1c.

As shown in FIG. 1c, wafer layer 408 is further bonded to the sacrificial oxide layer surface 404 and thinned as the MEMS wafer. The wafer 408 is a bulk silicon wafer in the illustrative embodiments, although other materials and combinations of material may also be employed. Wafer 408 may be fusion bonded to the sacrificial oxide layer surface. To accomplish the bonding, a set of cleaning processes may be performed on both the wafer 408 and the surface of sacrificial oxide layer 404 before the bonding. In an embodiment, the cleaning processes may further include one or more chemical-mechanical polishing (CMP) processes and/or etch processes to planarize the surfaces to be bonded. Before bonding, the wafers are cleaned by a water scrub process and dipped in HF for removal of surface oxide layer. Then, a surface plasma treatment is applied to create a hydrophilic surface in nitrogen and/or oxygen plasma environment. The two wafers are then placed in contact with one another with a point force at the center point or specific position to generate an initial bond point. A bond force of larger than 1 kN and a post anneal temperature of larger 200C can be applied to get a good bond strength. In an embodiment, the bond chamber has atmospheric pressure. However, in another embodiment, a vacuum chamber may be used as a bonding chamber. After the bonding, the wafer 408 is further thinned to a pre-defined thickness. In one embodiment the thickness is around 30 um; in other embodiments the thickness of wafer 408 can be as little as 2 μm or less and as much as 100 μm or more. The thinning process may include grinding and CMP steps, etch back steps, or other well known steps. As the oxide opening 405a, 405c, 405d, is only a small portion (<5%) of the sacrificial oxide layer 404, the bonding of wafer 408 can be treated as almost on a flat surface, providing for improved bonding quality or yield with its continuous bond wave propagation. In yet other embodiments, wafer 408 can be thinned before being bonded to sacrificial oxide layer 404.

Continuing on to FIG. 1f, MEMS via(s) 410 are formed in wafer 408. As illustrated, these vias 410 may be aligned and the same cross-sectional shape as openings 405a, 405c, and/or 405d. In other words, the MEMS vias 410 can take the shape of a conventional via structure (analogous to plan view shown in FIG. 1e), multiple vias (analogous to the plan view shown in FIG. 1d), a trench (analogous to the plan view shown in FIG. 1b), or some other form as will be apparent to those skilled in the art. Note, however, that MEMS vias 410 need not be of the identical size or shape as openings 405a, 405c, and/or 405d. The vias 410 in wafer 408 should, however, be aligned to the underlying openings in sacrificial oxide layer 404 to allow for the formation of plugs, as will be more fully described below.

Regardless of the shape of MEMS vias 410, the feature is formed by etching completely through wafer 408. This process, when using a silicon wafer 408 is referred to as a deep silicon etch, especially the known Bosch process, the process details of which will be apparent to those skilled in the relevant art.

Next, a layer of polysilicon 412 is formed over the structure, including within openings 405a, 405c, and/or 405d and MEMS vias 410, as illustrated by FIG. 1g. Note that polysilicon layer 412 not only fills the openings and vias, it also covers the top surface of wafer 408. Polysilicon is employed in the illustrative embodiments because it provides a good ohmic contact with underlying anchor electrodes 403a and with the vias side wall of the MEMS wafer. Process for good via fill are known to practitioners of the art. This polysilicon and Si ohmic contact is one of the figure of merit of this structure. To achieve that, during the deposition of the polysilicon, the in-situ doping method is adopted to obtain high doping polysilicon.

Next, polysilicon layer 412 is etched back to remove the portions of polysilicon layer 412 overlying wafer 408, while leaving a polysilicon plugs, such as plug 414, in vias 410 and openings 405a, 405c, and/or 405d. FIG. 1h illustrates an embodiment wherein polysilicon layer 412 is blanket etched back to remove all polysilicon from the top surface. This result could alternatively be obtained by a CMP process, for instance. FIG. 1i illustrates an alternative embodiment wherein portions of polysilicon layer 412 are left intact atop the surface of wafer 408. These portions could provide further structural integrity to the resulting MEMS device as well as providing a landing or contact pad for subsequently formed electrical connections, e.g., to anchor electrode 403a. In the embodiment illustrated in FIG. 1i, portions of polysilicon layer 412 are covered by, e.g., a photoresist material during the etch back process to protect those desired portions, as will be apparent to those skilled in the art.

FIG. 1j illustrates a next step in the process for the embodiment illustrated in FIG. 1h, wherein polysilicon layer 412 is completely removed from the top surface. As shown in FIG. 1j, contacts 416 may be formed atop wafer 408. In some embodiments, electrodes 416 are formed of TiW/Al, although various other conductors and conductive metals may be employed. For instance, electrodes 416 may be formed of a single metal, such as Al or Au, or an alloy such as AlCu. Alternatively, electrodes could be formed of multiple layers such as TiN/AlCu, TiN/Au, TiW/AlCu, TiW/Au, and like. Highly conductive polysilicon, conductive ceramics, and the like might also be used. The choice of the material depends on the electrical characteristics and etching resistance during the next sacrificial layer etching process. The conductive layer may be blanket deposited onto the surface and then patterned using known techniques to form contacts 416.

MEMS etch holes 418 are next formed in wafer 408, as illustrated in FIG. 1k. Etch holes 408 may be formed using similar processes as described above with respect to MEMS vias 410—although other processes could alternatively be employed. MEMS etch holes 418 expose the underlying sacrificial oxide layer 404. Sacrificial oxide layer 404 is then exposed to an etch process through etch holes 418. In an illustrative embodiment, sacrificial oxide layer 404 is subject to an HF vapor etch, so that portions of the sacrificial oxide layer 404 is removed, it depends on the layout design. This type of etch has high selectivity between sacrificial oxide layer 404, on the one hand, and polysilicon plugs 414. Hence, polysilicon plugs 414 reduce or eliminate the amount of undercutting at the anchor region. Likewise, HF vapor is highly selective between sacrificial oxide layer 404 and anchor electrodes 403a and sensing electrodes 403b, as well as contacts 416, as well as isolation layer 402, so those elements are not significantly attacked during the removal of sacrificial oxide layer 404. Note further that isolation layer 402 protects underlying wafer 400 during the removal of sacrificial oxide layer 404.

The resulting structure is illustrated in FIG. 1l. After removal of sacrificial oxide 404, MEMS structure 422 extends above cavity 424. MEMS structure is supported by hinges, springs, etc. (not shown) which extend from anchor region 420. Note that a portion of sacrificial oxide layer 404 remains within the region surrounded by polysilicon plug 414. This structure would result when polysilicon plug 414 takes the form of a closed curve, such as the trench 405a, illustrated in FIG. 1b. On the other hand, when polysilicon plug 414 is formed using vias in sacrificial oxide layer 404, such as the multiple vias 405c shown in FIG. 1d or the single via 405d shown in FIG. 1d, then the HF vapor is able to reach and attack all the sacrificial oxide layer 404, resulting in the structure illustrated in FIG. 1m. Note that no sacrificial oxide remains overlying anchor electrodes 403a in FIG. 1m. Various alternatives will become apparent to one skilled in the art informed by the teachings herein. As but a few examples, FIG. 1n illustrates an embodiment wherein polysilicon plugs 414 include a portion overlying wafer 408 (corresponding to the embodiment shown in FIG. 1i), after the formation of electrodes 416. In the illustrative embodiment, electrodes 416 align with and are of the same shape and size as the portion of polysilicon plugs 414 overlying wafer 408. In other embodiments (not shown), electrodes 416 may have a different size and shape as the portions of polysilicon plugs 414 overlying wafer 408, although they nonetheless are aligned, advantageously. FIG. 1o illustrates an embodiment similar to FIG. 1n, except that anchor electrode 403a and sensing 403b are not used in this embodiment. FIG. 1p illustrates an embodiment similar to that illustrated in FIG. 1o, except that polysilicon plugs 414 are completely etched back and do not extend over the surface of wafer 408.

An illustrative method for forming a MEMS system may comprise: forming an isolation layer on top of a silicon substrate; forming a sacrificial oxide layer on top of the isolation layer and forming an opening on the sacrificial oxide layer that reaches the isolation layer, wherein the sacrificial oxide layer has a flat surface; bonding a Si wafer layer to the sacrificial oxide layer surface and opening a MEMS via in the Si wafer aligned with the oxide opening in the sacrificial oxide layer; filling the aligned MEMS via and the oxide opening with polysilicon material to form a polysilicon stack; forming an etch hole through the Si wafer; and forming a cavity by etching the sacrificial oxide layer under the Si wafer layer.

An illustrative method for forming a MEMS system may further comprise: forming a polysilicon layer between the sacrificial oxide layer and the isolation layer to form a polysilicon anchor area and a sensing electrode area; forming a sacrificial oxide layer on top of the isolation layer and etching an opening on the sacrificial oxide layer that reaches the polysilicon anchor area, wherein the sacrificial oxide layer has a flat surface; bonding a Si wafer layer to the sacrificial oxide layer surface and opening a MEMS via in the Si wafer aligned with the oxide opening in the sacrificial oxide layer; filling the aligned MEMS via and the oxide opening with polysilicon material to form a polysilicon stack; etching through the Si wafer to form an etch hole; and forming a cavity by etching the sacrificial oxide layer under the Si wafer layer.

What is claimed is:

1. A micro-electromechanical system (MEMS), comprising:
    a substrate;
    an isolation layer on top of the substrate, wherein the isolation layer comprises silicon nitride;
    a sacrificial layer on top of the isolation layer, wherein the sacrificial layer has a flat surface and at least one opening extending therethrough;
    a wafer layer bonded to the sacrificial layer, wherein the wafer layer has at least one MEMS via;
    a conductor stack within the at least one MEMS via;
    a MEMS structure formed in the wafer; and
    a cavity between the isolation layer and the MEMS structure.

2. The MEMS of claim 1, further comprising an anchor electrode on the isolation layer and wherein the conductor stack extends to and contacts the anchor electrode.

3. The MEMS of claim 1, wherein the wafer layer has a thickness between 2 to 100 um.

4. The MEMS of claim 1, further comprising an opening in the sacrificial layer aligned to at least one MEMS via, the conductor stack extending through the opening.

5. The MEMS of claim 1, wherein the conductor stack is in the form of a trench surrounding a region of the sacrificial layer, a single via, or multiple vias.

6. The MEMS of claim 1, wherein the at least one opening comprises about five percent or less of the surface area of the sacrificial layer.

7. A system, comprising:
    a substrate;
    an isolation layer atop the substrate;
    a sacrificial layer atop the isolation layer;
    a first opening extending through the sacrificial layer;
    a wafer layer bonded to the sacrificial layer;
    a second opening extending through the wafer layer, and aligned with the first opening;
    a conductor stack filling the first opening and the second opening, wherein the conductor stack comprises doped polysilicon;
    an etch hole extending through the wafer layer; and
    a cavity under a region of the wafer layer.

8. The system of claim 7, further including:
    a MEMS structure formed in the wafer layer.

9. The system of claim 7, further comprising:
    a contact atop the conductor stack.

10. The system of claim 9, wherein the contact atop the conductor stack comprises a material selected from the group consisting of Ti, W, Al, Cu, polysilicon, compositions thereof, and combinations thereof.

11. The system of claim 7, further comprising an electrode on the isolation layer.

12. The system of claim 11 wherein the electrode on the isolation layer is aligned with the conductor stack.

13. The system of claim 7, wherein the wafer layer comprises a bulk silicon layer.

14. A system comprising:
    a silicon-containing substrate;
    a nitride layer on the substrate;

a sacrificial oxide layer on the nitride layer, wherein the sacrificial oxide layer has at least one opening extending therethrough;

a silicon layer bonded to the sacrificial layer, wherein the silicon layer has at least one MEMS via extending therethrough, the at least one MEMS via being aligned with the at least one opening in the sacrificial oxide layer;

a polysilicon conductor within the at least one MEMS via and the at least one opening in the sacrificial oxide;

a MEMS structure formed in the silicon layer; and a cavity between the nitride layer and the MEMS structure.

15. The system of claim 14, further comprising an electrode on the nitride layer and aligned with the polysilicon conductor.

16. The system of claim 14, wherein the silicon has a thickness of from about 2 μm to about 100 μm.

17. The system of claim 14, further comprising a contact atop the polysilicon conductor.

18. The system of claim 14, wherein the polysilicon extends through the silicon layer and partially overlies the silicon layer.

\* \* \* \* \*